United States Patent [19]

Saeki

[11] Patent Number: 5,223,001
[45] Date of Patent: Jun. 29, 1993

[54] VACUUM PROCESSING APPARATUS

[75] Inventor: Hiroaki Saeki, Yamanashi, Japan

[73] Assignee: Tokyo Electron Kabushiki Kaisha, Japan

[21] Appl. No.: 978,750

[22] Filed: Nov. 19, 1992

[30] Foreign Application Priority Data

Nov. 21, 1991 [JP] Japan .................................. 3-306224
Nov. 21, 1991 [JP] Japan .................................. 3-306225

[51] Int. Cl.⁵ .............................................. C23C 16/00
[52] U.S. Cl. ................................ 29/25.01; 414/217;
156/345; 204/298.25; 118/719
[58] Field of Search .................... 29/25.01; 204/298.25;
156/345; 118/719; 414/217

[56] References Cited

U.S. PATENT DOCUMENTS

| | | | |
|---|---|---|---|
| 4,824,545 | 4/1989 | Arnold | 118/719 |
| 4,828,224 | 5/1989 | Crabb | 414/217 |
| 5,084,125 | 1/1992 | Aoi | 156/345 |
| 5,139,459 | 8/1992 | Takahashi | 204/298.25 |

Primary Examiner—Richard Bueker
Attorney, Agent, or Firm—Beveridge, DeGrandi & Weilacher

[57] ABSTRACT

The present invention is a vacuum processing apparatus provided with a vacuum processing chamber which implements a required processing to an object of processing, and a pre-vacuum chamber (load-lock chamber) configured so that it can be internally vacuum exhausted, with an object of processing being carried-in and -out of the vacuum processing chamber via the pre-vacuum chamber, in which a small space which can be airtightly sealed is provided inside the pre-vacuum chamber, so that the object of processing can be temporarily withdrawn into and housed in the small space when there is vacuum exhaust from the pre-vacuum chamber and when there is the introduction of air to the pre-vacuum chamber. Thus, it is possible to prevent the adhesion to the processing object of particles which rise when air is introduced to the load-lock chamber and when air is exhausted from the load-lock chamber, and without having to perform slow exhaust and slow venting, while increases the throughput and the yield at the same time.

7 Claims, 6 Drawing Sheets

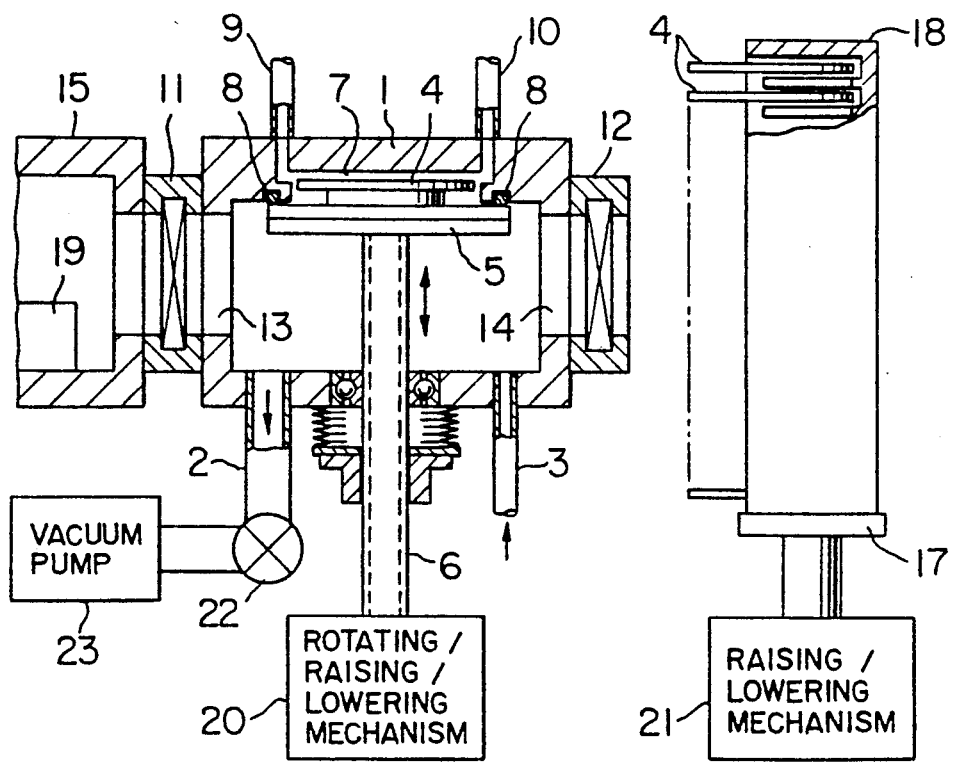
F I G. 1
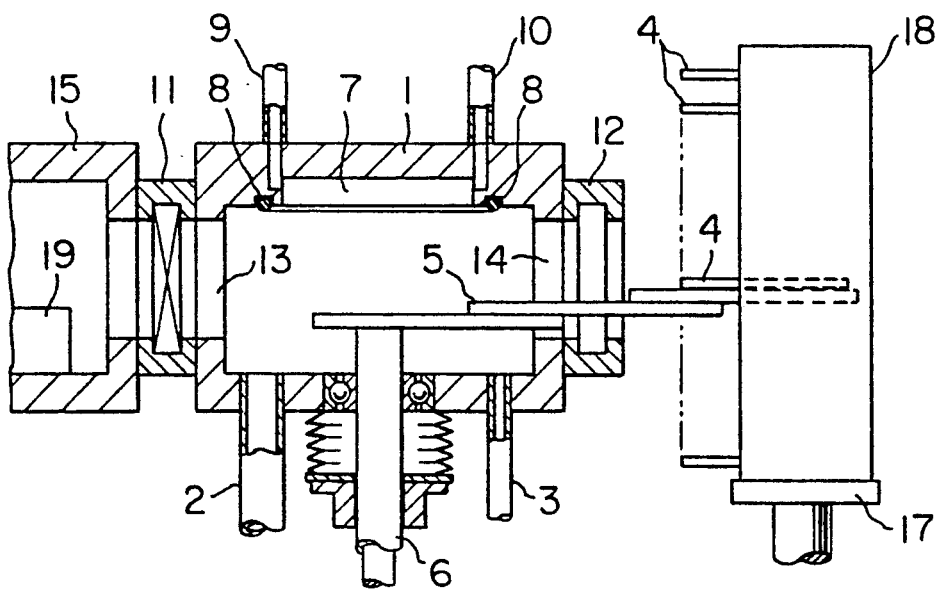
F I G. 2

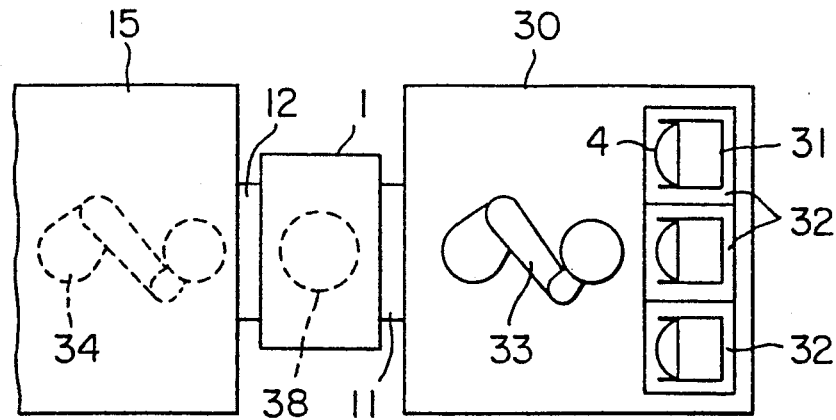
F I G. 5
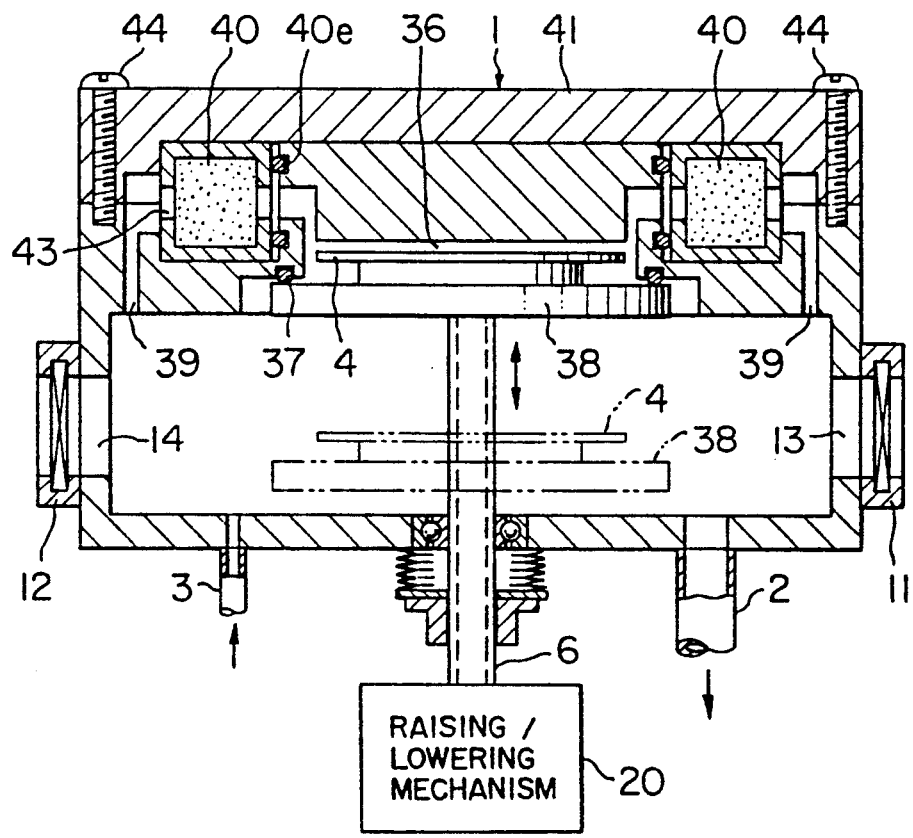
F I G. 6

VACUUM PROCESSING APPARATUS

BACKGROUND TO THE INVENTION

The present invention relates to vacuum processing apparatus for semiconductor wafers and other objects of processing.

Conventionally, there have been known etching apparatus, ashing apparatus, ion injection apparatus, spatter apparatus, pressure reduction CVD apparatus and other types of vacuum processing apparatus which house semiconductor wafers or some other objects of processing inside a vacuum processing chamber and implement a required processing to the object of processing when there is an atmosphere of reduced pressure.

In such vacuum processing apparatus, once the inside of the vacuum-- processing chamber is returned to normal pressure, it is necessary to-have an extremely long time until the inside of the vacuum processing chamber is set to the required degree of vacuum and there is the status where the next processing can be started. Because of this, there are many instances where a load-lock chamber or pre-vacuum chamber having a comparatively small volume when compared to the vacuum processing chamber is provided adjacent to the vacuum processing chamber, so that simply returning this load-lock chamber to normal pressure enables the semiconductor wafers of other objects of processing to be carried in and out of the vacuum pressure chamber via this load-lock chamber.

FIG. 10 shows an outline configuration of an etching apparatus which is one example of such a conventional type of vacuum pressure apparatus. Inside the vacuum processing chamber 50 which is configured so that the inside is airtight, the upper portion is provided a lower portion electrode 52 which is also a wafer mounting platform configured so as to enable the mounting of a semiconductor wafer 51. This lower portion electrode 52 is driven by a drive mechanism 53 and is provided with a wafer clamp mechanism 54 which presses against and holds the peripheral edge portion of the semiconductor wafer 51. In addition, internal to the lower portion electrode 52 are provided cooling mechanisms 55a~55c for circulating helium gas or some other coolant gas for cooling the semiconductor wafer 51.

In addition, to the top of the lower portion electrode 52 is provided an upper portion electrode 56 formed in the shape of a cylinder. To the lower surface of this upper portion electrode 56 are provided many holes 56a and the required etching gas supplied from the processing gas supply pipe 57 flows from these holes 56a and is supplied in the direction of the processing surface of the semiconductor wafer 51 mounted on the lower portion electrode 52. Between the upper portion electrode 56 and the lower portion electrode 52 can be impressed a high-frequency voltage from a high-frequency power source (not shown).

Furthermore, a vacuum exhaust pipe 58 connected to a vacuum exhaust pump is connected to the vacuum processing chamber 50 in a configuration whereby the inside of the vacuum processing chamber 50 can have vacuum suction to a required degree of vacuum. In addition, to the side portion of the vacuum processing chamber 50 is provided a carrying-in and -out opening 59 for carrying-in and -out the semiconductor wafer 51, and this carrying-in and -out opening 59 is provided with a gate valve 60 airtightly sealing the carrying-in and -out opening 59. Furthermore, to the outer side of the gate valve 60 is provided a load-lock chamber 61. A gas introduction pipe 63 for the supply of nitrogen gas or some other required cleaned gas and a vacuum exhaust pipe 62 connected to the vacuum exhaust pump (not shown) are both connected to this load-lock chamber 61 in a configuration where the inside of the load-lock chamber 61 is set to a required degree of vacuum and can be returned to an atmospheric pressure for opening. In addition, the inside of the load-lock chamber 61 is provided with a conveyor arm 64 for conveying the semiconductor wafer 51, and a side portion of the load-lock chamber 61 is provided with a carrying-in and -out opening 65 for carrying-in and -out the semiconductor wafer 51. This carrying-in and -out opening 65 is provided with a gate valve 66 for airtightly sealing the carrying-in and -out opening 65 and here is for example arranged an auto-loader 67 having a wafer carriers (not shown) and the like arranged to it.

In such a vacuum processing apparatus, the configuration is such that the load-lock chamber 61 is first set to a large pressure, the gate valve 66 is opened and the contraction and extension of the conveyor arm 64 carries the semiconductor wafer 51 from the autoloader 67 into the load-lock chamber 61. After this, the gate valve 66 is then opened, and the semiconductor wafer 51 is mounted on the lower portion electrode 52 of the vacuum processing chamber 50. By carrying the semiconductor wafer 51 into the gate valve 60 via the load-lock chamber 61, it is possible to carry in the semiconductor wafer 51 without having to return the inside of the vacuum processing chamber 50 to a large pressure. Moreover, the carrying out of the semiconductor wafer 51 is performed using a procedure the reverse of that described above.

In addition, inside the vacuum processing chamber 50, the peripheral edge portion of the semiconductor wafer 51 is pressed against and held by the wafer clamp mechanism 54, and while the semiconductor wafer 51 is cooled by the cooling mechanisms 55a~55c, etching gas is supplied from the lower surface of the upper portion electrode 56 and is activated by a high-frequency voltage impressed between the lower portion electrode 52 and the upper portion electrode 56 to implement etching processing to the semiconductor wafer 51. Moreover, at this time, vacuum suction is implemented by the vacuum exhaust pipe 58 and the inside of the vacuum processing chamber 50 is held at a required degree of vacuum.

However, with such a vacuum processing apparatus, the inside of the load-lock chamber 61 contains many reaction products generated inside the vacuum processing chamber 50, and dust and other particles generated from mechanical drive portions such as the gate valve 60, 66 and the processing object conveyor mechanism and the like. When vacuum suction of the inside of the load-lock chamber 61 is performed or when nitrogen or some other gas is introduced into the load-lock chamber 61 to return it to normal pressure for opening, these particles (with a size of about 0.3~0.5 $\mu$m) rise with the sudden stream of air upon opening and cause a problem in that they adhere to the semiconductor wafer 51 and the like. This problem is a large problem in that it causes an increased number of defective products in semiconductor device manufacturing processes using semiconductor wafer 51 and the like, and a consequent drop in the yield.

Because of this, with a conventional vacuum processing apparatus, a slow exhaust method in which air is slowly exhausted from the load-lock chamber 61 and a slow vent method whereby air is slowly reintroduced to the load-lock chamber 61 are used so that this rising of particles inside the load-lock chamber 61 is controlled.

However, with such a conventional vacuum processing apparatus, controlling the rise of particles inside the load-lock chamber 61 by the slow-exhaust or the slow-vent method involves an increase in the time for vacuum exhaust and for opening to the atmosphere and this therefore involves the problem of reduced throughput. Furthermore, even if slow exhaust and slow vent are performed, it is difficult to completely prevent the rise of particles, as some particles still adhere to the semiconductor wafer and cause faults, and the same problem of reduction of the yield.

SUMMARY OF THE INVENTION

In order to solve the problems associated with the conventional art, an object of the present invention is to provide a vacuum processing apparatus which can increase the throughput and the yield and at the same time prevent the adhesion to the processing object of particles which rise when air is introduced to the load-lock chamber and when air is exhausted from the load-lock chamber, and without having to perform slow exhaust and slow venting.

More specifically, the vacuum processing apparatus of the present invention is a vacuum processing apparatus which is provided with a vacuum processing chamber which implements a required processing to an object of processing, and a pre-vacuum chamber (load-lock chamber) configured so that it can be internally vacuum exhausted, with an object of processing being carried-in and -out of the vacuum processing chamber via this pre-vacuum chamber, and is characterized in that a small space which can be airtightly sealed is provided inside the pre-vacuum chamber, so that the object of processing can be temporarily housed into this small space when there is vacuum exhaust from the pre-vacuum chamber and when there is the introduction of air to the pre-vacuum chamber.

In the vacuum processing apparatus of the present invention and having the configuration described above, a small space which can be airtightly sealed is provided to the upper portion of the pre-vacuum chamber (load-lock chamber) for example. Then, when there is the rapid vacuum exhaust of gas from the load-lock chamber and the rapid introduction of gas when there is opening to the atmosphere, slow exhaust need only be performed for the inside of the small space into which the object for processing has been temporarily withdrawn.

Accordingly, even if slow exhaust and slow venting of the inside of the load-lock chamber are not performed, it is possible to prevent the adhesion to the processing object of particles which rise inside the load-lock chamber.

In addition, with another embodiment of the vacuum processing apparatus of the present invention, the configuration is such that a small space which can house an object of processing is provided inside the pre-vacuum chamber and there is also provided an gas flow passage which connects the small space and the inside of the pre-vacuum chamber. This gas flow passage has a dust removal filter placed along it. The object of processing is then temporarily withdrawn to the small space when there is the introduction of air to the pre-vacuum chamber and when there is vacuum exhaust from the pre-vacuum chamber.

BRIEF DESCRIPTION OF THE DRAWINGS

FIG. 1 is a view of a first configuration of a vacuum processing apparatus of the present invention;

FIG. 2 is an outline view showing the status when a gate valve in the vacuum processing apparatus shown in FIG. 1 has been opened and a conveyor arm has taken a semiconductor wafer from a wafer carrier;

FIG. 5 is a view of a configuration (plan view) of a second embodiment of the vacuum processing apparatus of the present invention, where an auto-loader is used for carrying in the semiconductor wafers;

FIG. 6 is a longitudinal sectional view of an embodiment wherein a dust removal filter is arranged to an upper portion inside the pre-vacuum chamber;

DETAILED DESCRIPTION OF THE PREFERRED EMBODIMENTS

First Embodiment

Figure 3:
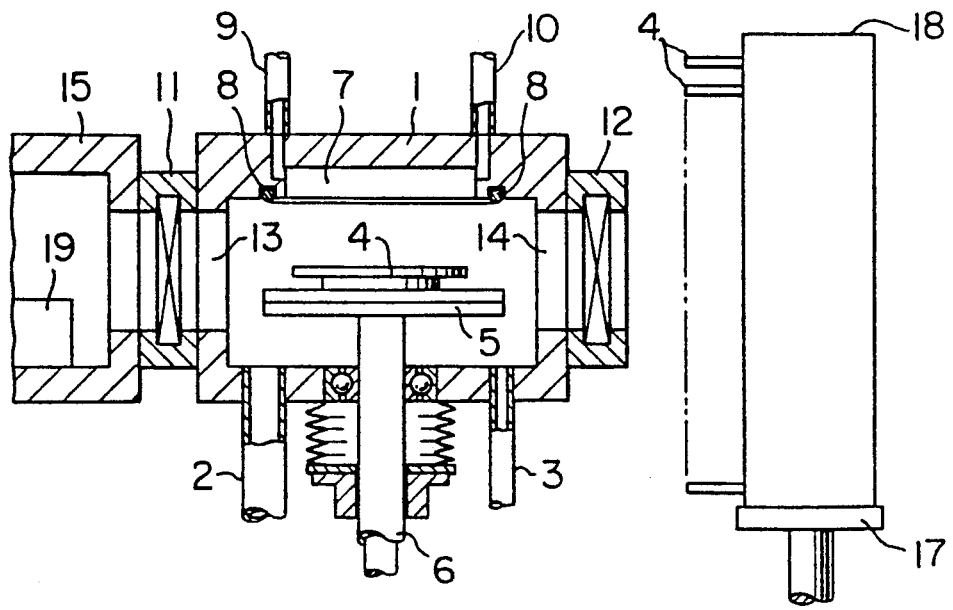
FIG. 3 is an outline view showing the status where a semiconductor wafer has been carried into the pre-vacuum chamber and the gate valve has been opened.

The following is a description of a first embodiment wherein the present invention has been applied to a vacuum processing apparatus which implements a required processing to a semiconductor wafer under an atmosphere of reduced pressure.

As shown in FIG. 1, a load-lock chamber 1 of the vacuum processing apparatus of the present embodiment is formed in the shape of a cylindrical container, the bottom portion of which is connected to an exhaust pipe 2 connected to a vacuum pump 23 via a partition valve, and an gas introduction pipe 3 connected to an gas supply source (not shown), and which is connected to a nitrogen gas supply source for example. In addition, internal to the load-lock chamber 1 are arranged conveyor arms 5 in a plural number of stages (such as 3, for example) and which serve as the conveyor mechanism for conveying the semiconductor wafer 4. These conveyor arms 5 are connected via a shaft 6 to an external conveyor drive mechanism (a rotating and raising/lowering mechanism), the rotation and elongation and contraction of which conveys the semiconductor wafer 4 mounted on its upper surface. In addition, as shown by the arrow in the figure, these conveyor arms 5 are configured so as to be movable up and down by the rotating and raising/lowering mechanism 20.

Furthermore, to the ceiling of the inside of the load-lock chamber 1 is formed a circular concave portion 7 so as to form a small space which can be airtightly sealed. This concave portion (small space) 7 has its size set to slightly larger than the diameter of the semiconductor wafer 4 and the periphery of the concave portion 7 is provided with an O-ring 8. Then, the raising of the conveyor arms 5 by the rotating and raising/lowering mechanism 20 causes the conveyor arm 5 which supports the semiconductor wafer 4 to come into contact with the O-ring 8 so that there is an airtight seal, in a configuration where the semiconductor wafer 4 is separated from the other portions of the load-lock chamber 1 and is in a status where it is airtightly housed inside the concave portion 7. In addition, connected to this concave portion 7 are a small-space exhaust pipe 9 which is connected to a vacuum pump (not shown), and a small-space gas introduction pipe 10 connected a gas supply source (not shown), and which is a nitrogen gas supply source for example.

In addition, to the side portion of the load-lock chamber 1 are provided carrying-in and -out openings 13, 14 which are airtightly sealed by gate valves 11, 12. The carrying-in and -out opening 13 communicates with the adjacent vacuum processing chamber 15 while the carrying-in and -out opening 14 opens in the direction of the outside of the load-lock chamber 1. To an outside portion of the load-lock chamber 1 is provided a wafer carrier mounting platform 17 and on this wafer carrier mounting platform 17 is mounted a wafer carrier 18 which is configured so as to house a plural number (such as 25) semiconductor wafer 4.

The vacuum processing chamber 15 is configured in the same manner as the etching apparatus described earlier with reference to FIG. 10, and is provided with an exhaust apparatus, a processing gas supply apparatus and other apparatus, none of which are shown in the figure. In addition, there is also a wafer mounting platform (lower portion electrode) 19 mounted internally. The configuration is therefore such that the semiconductor wafer 4 is mounted on the wafer mounting platform 19 and a required processing is implemented to the semiconductor wafer 4 under an atmosphere of a required reduced pressure. Moreover, in addition to etching processing, this processing can be ashing processing, ion injection processing, spatter processing or pressure-reduced CVD processing or the like.

A vacuum processing apparatus of a first embodiment and having the configuration described above is controlled by a control apparatus (not shown) and which is configured from a microprocessor or the like, and uses the following operations to implement processing for the semiconductor wafer 4.

More specifically, as shown in FIG. 2, the gate valve 12 is first opened in the status where the inside of the load-lock chamber 1 is at normal pressure, and the elongation of the conveyor arm 5 takes one of a required semiconductor wafer 4 inside the wafer carrier 18. When this is done, the wafer carrier 18 moves up and down because of the wafer carrier mounting platform 17 and the required semiconductor wafer 4 is set at a position, the height of which corresponds to the height of the conveyor arm 5.

After this, the contraction and rotation of the conveyor arm 5 houses the semiconductor wafer 4 inside the load-lock chamber 1 as shown in FIG. 3, and the gate valve 12 closes.

After this, the conveyor arm 5 rises and as shown in FIG. 1, the semiconductor wafer 4 is housed inside the concave portion 7, the conveyor arm 5 and the O-ring 8 come into contact, and the semiconductor wafer 4 is isolated in an airtight status inside the concave portion 7. Then, the exhaust pipe 2 performs exhaust of the inside of the load-lock chamber 1 and the small-space exhaust pipe 9 performs gas exhaust from inside the concave portion 7 and the inside of the small space and the inside of the load-lock chamber 1 are set to a required degree of vacuum of for example, $10^{-5} \sim 10^{-6}$ Torr. At this time, slow exhaust is performed for inside the concave portion 7 while rapid exhaust is performed for inside the load-lock chamber 1. Because of this, particles which are present inside the load-lock chamber 1 rise but the semiconductor wafer 4 is airtightly isolated inside the concave portion 7 and so there is no adhesion of these particles to the semiconductor wafer 4. Moreover, fast gas exhaust can be performed and so it is possible for there to be a greatly reduced exhaust time when compared to slow exhaust. Also, the particles which rise along with fast exhaust fall to the bottom of the load-lock chamber 1 accompanying an increase in the degree of vacuum.

Figure 4:
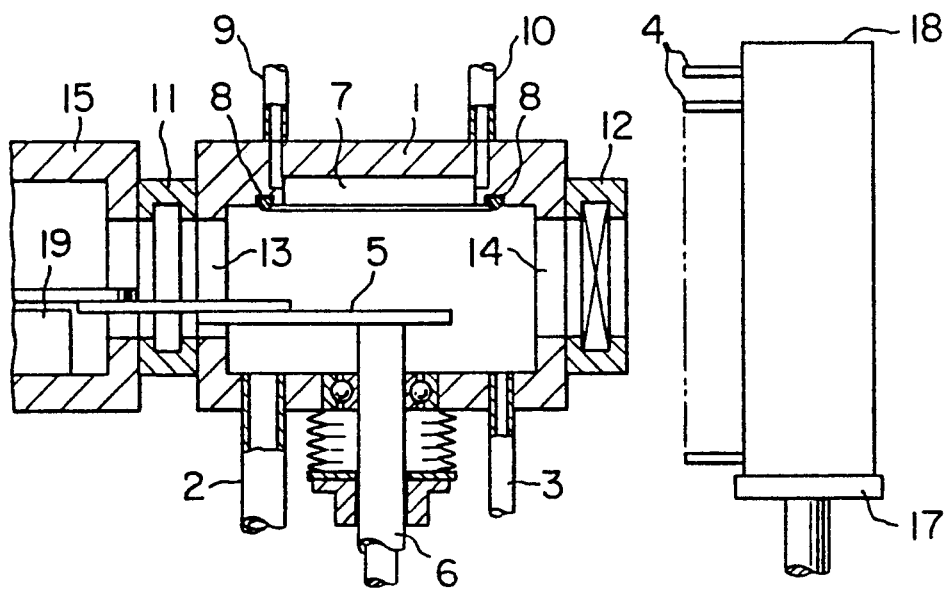
FIG. 4 is an outline view showing the status where the gate valve on the side of the vacuum processing chamber has been opened and the semiconductor wafer has been carried from the pre-vacuum chamber and into the vacuum processing chamber.

In this manner, when there is a certain increase in the degree of vacuum inside the load-lock chamber 1 and the particles which have risen have then fallen to the bottom, the conveyor arm 5 lowers and as shown in FIG. 4, the gate valve 11 opens and the elongation and rotation of the conveyor arm 5 inside the vacuum processing chamber 15 which is set to a required degree of vacuum, carries in the semiconductor wafer 4 and mounts the semiconductor wafer 4 onto the wafer mounting platform 19.

After this, the conveyor arm 5 contracts, the gate valve 11 closes, and the required processing described above is implemented to the semiconductor wafer 4 inside the vacuum processing chamber 15.

Moreover, the vacuum processing chamber 15 is generally provided with two adjacent load-lock chambers 1, with one being used for carrying the semiconductor wafers 4 into the vacuum processing chamber 15, and the other being used for carrying the semiconductor wafers 4 out, thereby increasing the throughput. When there are two load-lock chambers 1 provided in this manner, the operations described above are performed and then repetitions of the same operations are performed in preparation for carrying in the next semiconductor wafer 4. In addition, when there is only one load-lock chamber 1, there is standby until the end of processing inside the vacuum processing chamber 15, the semiconductor wafer 4 for which processing has been completed is carried out from the vacuum processing chamber 15 by a series of operations the reverse of those described above, and when these have finished, the next semiconductor wafer 4 is carried in via the load-lock chamber 1.

In either case, when the processing inside the vacuum processing chamber 15 has finished and the semiconductor wafer 4 is carried out, the semiconductor wafer 4 which is taken from the vacuum processing chamber 15 to inside the load-lock chamber 1 is isolated in an airtight status inside the concave portion 7 and as shown in FIG. 1 and so nitrogen or some other required cleaned gas is introduced into the load-lock chamber 1 and the concave portion 7 and these two portions returned to normal pressure. Because of this, particles rise inside the load-lock chamber 1 but the semiconductor wafer 4 is completely isolated and housed inside the concave portion 7 and so these particles cannot adhere to the semiconductor wafer 4. In addition, the time required for venting can be shortened considerably when compared to that required when slow venting is performed.

In this manner, with this first embodiment, when there is exhausts of the load-lock chamber 1 and the introduction of air to it, the semiconductor wafer 4 is isolated in an airtight status inside a concave portion 7 provided to an upper portion of the load-lock chamber 1 when gas exhaust and gas introduction are performed and so it is possible to prevent particles which rise inside the load-lock chamber 1 along with the flow of gas, from adhering to the semiconductor wafer. Because of this, it is possible to prevent the generation of defective products due to the adhesion of particles, and to consequently increase the yield. Not only this, it is also possible for exhausting and the introducing of gas to be performed rapidly and so it is possible to have a reduction in the time required for processing, and consequently raise the throughput. Whereas a conventional apparatus required 40 seconds for the degree of vacuum inside the load-lock chamber 1 to be raised from 760 Torr to 0.001 Torr, the apparatus of the present invention required the greatly reduced time of only 10 second for example.

Furthermore, the concave portion 7 for isolating the semiconductor wafer 4 is provided to the upper portion of the load-lock chamber 1 and so it is possible to quickly isolate the semiconductor wafer 4 by only raising it slightly, thereby suppressing the generation of particles and having a minimum of mechanical movement inside the load-lock chamber 1.

In addition, the object of processing is not limited to semiconductor wafers, as the present invention can also be applied to apparatus for the implementation of processing to glass substrates for liquid crystal displays (LCD), for example.

The vacuum processing apparatus of the present invention is a vacuum processing apparatus which houses an object of vacuum processing and which implements a required processing to an object of processing under an atmosphere of reduced pressure, and can for example be used in etching apparatus, ashing apparatus, ion injection apparatus, spatter apparatus, reduced pressure CVD apparatus and the like.

According to a vacuum processing apparatus of the present invention and as described above, it is possible to greatly prevent the adhesion to an object of processing, of particles which rise when there is vacuum exhaust from a load-lock chamber and when there is the introduction of air to a load-lock chamber.

Second Embodiment

As shown in FIG. 5, a second embodiment of the present invention is provided with a vacuum processing chamber 15, a load-lock chamber 1 and an auto-loader 30.

To the auto-loader 30 is mounted a wafer carrier 31 configured so that a plural number of semiconductor wafers 4 (such as 25, for example) can be housed in it, and the auto-loader 30 is provided with a plural number of carrier elevators 32 which raise and lower the wafer carriers 31, and a conveyor arm 33 for conveying the semiconductor wafers 4. The up and down motion of the wafer carriers 31 due to the carrier elevators 32 successively sets the semiconductor wafer 4 inside the wafer carrier 31 to a required height, the conveyor arm 33 then takes the semiconductor wafer 4 set at the required height and rotates and elongates and contracts to carry the semiconductor wafer 4 into the load-lock chamber 1.

As shown in FIG. 6 the load-lock chamber 1 of the vacuum processing apparatus of the present embodiment is formed as a container of aluminum or the like, and the side of the vacuum processing chamber 15 and the side of the load-lock chamber 1 are respectively provided with openings 13, 14 for carrying-in and carrying-out. These openings 13, 14 are each provided with gate valves 11, 12 configured so as to airtightly close the openings. In addition, the inside of the load-lock chamber 1 is provided with a wafer stage 38 configured so as to be raised and lowered by a raising/lowering mechanism 20, and the semiconductor wafer 4 which has been carried in by the conveyor arm 33 of the auto-loader 30 is mounted on this wafer stage 38.

In addition, the ceiling of the inside of the wafer stage 38 is formed a circular concave portion 36 so as to form a small space which houses the semiconductor wafer 4. The periphery of the concave portion (small space) 36 is provided with an O-ring 37 which forms an airtight seal. Then, the raising of wafer stage 38 by the raising/lowering mechanism 20 houses the semiconductor wafer 4 inside the concave portion 36 and also causes the edge portion of the wafer stage 38 to come into contact with the O-ring 37 so as to form an airtight seal. Furthermore, a plural number of gas flow passages 39 provided, a plural number of gas flow passages 39 provided, connect with the inside of the other load-lock chamber 1 and these gas flow passages have dust removal filters 40 inserted into them.

Figure 7:
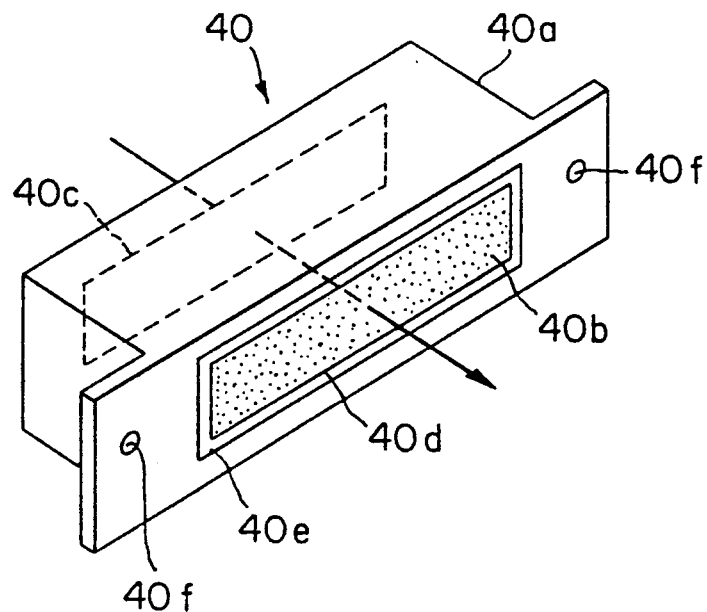
FIG. 7 is a perspective view of the dust removal filter shown in FIG. 6.

These dust removal filters 40 are configured as detachable units so that they can be exchanged. For example, as shown in FIG. 7, the configuration is such that the inside of a filter container 40a of aluminum or the like is filled with a ceramic substance or glass fiber or metal mesh which has been compressed into sheets. To this filter container 40a are provided gas flow passage openings 40c, 40d and to the side of the opening 40d is arranged a mounting screw hole 40f and an O-ring 40e which is the air sealing member. Then the screw 44 is loosened and the cover 41 of the load-lock chamber 1 shown in FIG. 6 can be removed, an when there is this status, the screw (not shown) can be used to either mount or remove a dust removal filter 40 to or from the load-lock chamber 1 via the screw hole 40f.

In addition, as shown in FIG. 6, to the bottom of the load-lock chamber 1 are connected an exhaust pipe 2 connected to a vacuum pump (not shown), and an gas introduction pipe 3 connected to an gas supply source (not shown), and which is connected to a nitrogen gas supply source for example.

Figure 10:
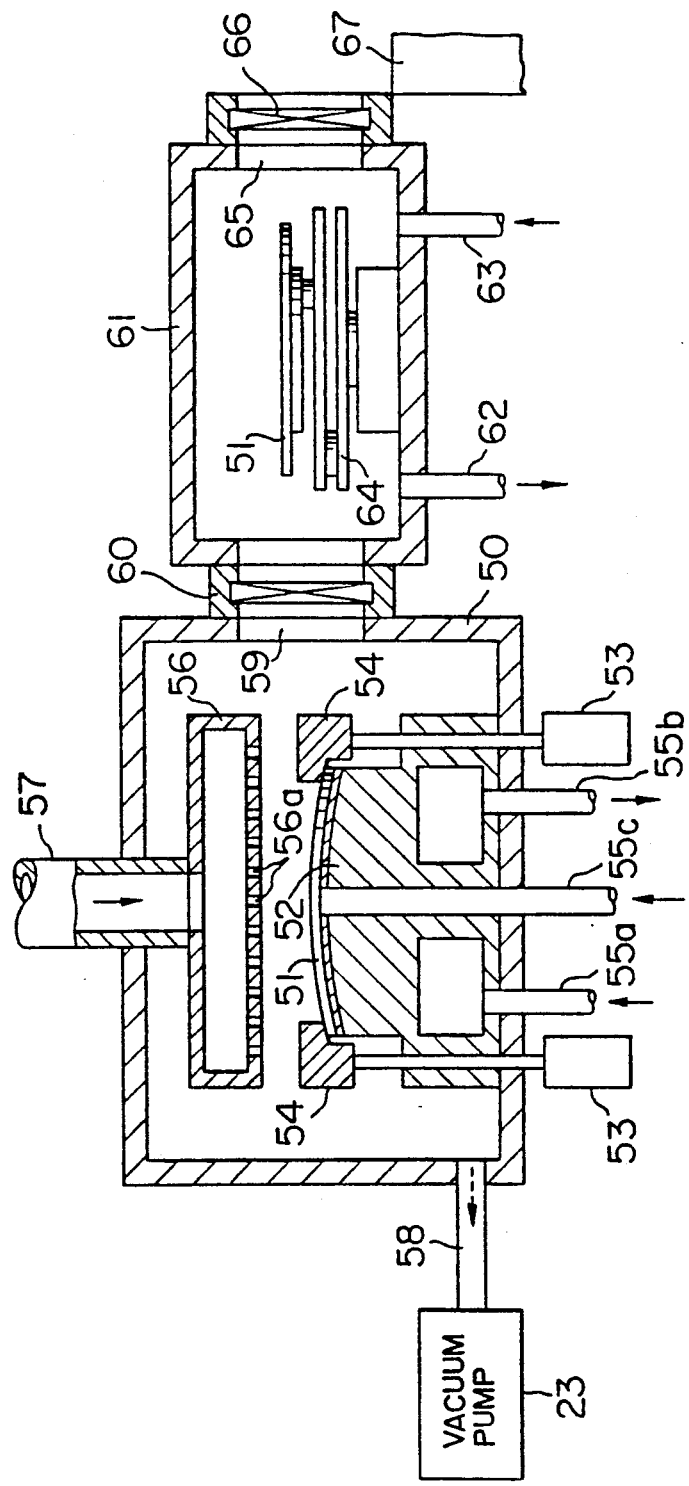
FIG. 10 is an outline view of a configuration of a conventional etching apparatus.

In addition, as shown in FIG. 5, internal to the vacuum processing chamber 15 are provided an etching apparatus and a vacuum processing apparatus and a wafer mounting platform (lower electrode portion) not shown in the figure but in the same manner as showing FIG. 10, and a conveyor arm 34. A semiconductor wafer 4 which is mounted on the wafer stage 38 inside the load-lock chamber 1 is carried into the load-lock chamber 1 by another conveyor arm 34, is mounted on the wafer mounting platform in a configuration where a required etching processing is implemented to the semiconductor wafer 4 under an atmosphere of a required reduced pressure. Moreover, in addition to etching processing, this processing can be ashing processing, ion injection processing, spatter processing or pressure-reduced CVD processing or the like.

Moreover, adjacent to the vacuum processing chamber 15 and not shown in the figure, are provided with an auto-loader and a load-lock chamber for carrying out, and this auto-loader and load-lock chamber are configured so as to house a semiconductor wafer 4 after processing inside the vacuum processing chamber 15 has finished and house it in a required wafer carrier. This carrying-in and -out of the semiconductor wafer 4 can be implemented by a single auto-loader 30 and load-lock chamber 1 as was the case for the etching apparatus shown in FIG. 10 but the throughput will lower if this is down.

A vacuum processing apparatus of a second embodiment and having the configuration described above is controlled by a control apparatus (not shown) and which is configured from a microprocessor or the like, and implements processing to a semiconductor wafer 4 by the same operations as the first embodiment.

More specifically, the gate valve 11 is first opened in the status where the inside of the load-lock chamber 1 is at normal pressure, and the conveyor arm 33 takes one of a required semiconductor wafer 4 inside the wafer carrier 31. When this is done, the wafer carrier 31 moves up and down because of the carrier elevator 32 and is set to a position having a required height corresponding to the height of the conveyor arm 33.

After this, the contraction and rotation of the conveyor arm 33 carriers the semiconductor wafer 4 and mounts it to the wafer stage 38 inside the load-lock chamber 1. After this, the conveyor arm 33 retreats and the gate valve 11 closes.

After this, the wafer stage 38 rises, the semiconductor wafer 4 is housed inside the concave portion 36 as shown in FIG. 6, the wafer stage 38 and the O-ring 37 come into contact and the semiconductor wafer 4 is in an airtight status isolated inside the concave portion 36. Then, exhaust of the inside of the load-lock chamber 1 is performed by the exhaust pipe 2 and the inside of the load-lock chamber 1 is set to a required degree of vacuum of for example, $10^{-5} \sim 10^{-6}$ Torr. After this, the operation is the same as that for the first embodiment.

Moreover, the exhausting of the inside of the concave portion 36 can be performed via the gas flow path 39 but the dust removal filters 40 are inserted along the gas flow path 39 and so dust which has risen inside the load-lock chamber 1 is not taken into the concave portion 36 and so there is no adhesion of it to the semiconductor wafer 4. Also, the particles which rise along with fast exhaust fall to the bottom of the load-lock chamber 1 accompanying an increase in the degree of vacuum.

In this manner, when there is a certain increase in the degree of vacuum inside the load-lock chamber 1 and the particles which have risen have then fallen to the bottom, the wafer stage 38 lowers to a required position. Then, the gate valve 12 opens and the conveyor arm 34 carries the semiconductor wafer 4 to inside the vacuum processing chamber 15 which has been set beforehand to a required degree of vacuum and mounts it on the wafer mounting platform not shown in the figure.

After this, the gate valve 12 is closed, and the required processing is implemented to the semiconductor wafer 4 inside the vacuum processing chamber 15.

When the processing inside the vacuum processing chamber 15 has finished and the semiconductor wafer 4 is carried out, the semiconductor wafer 4 inside the vacuum processing chamber 15 is carried out via the carrying-out load-lock chamber and auto-loader not shown in the figure and which are configured in the same manner as the load-lock chamber 1 and the auto-loader 30.

In addition, in the second embodiment, the inside of the concave portion 36 and the load-lock chamber 1 are connected by a gas flow passage along which are inserted dust removal filters 40, and the exhaust of the inside of the concave portion 36 and the introduction of gas to it are performed via this gas flow passage and so it is not necessary for example, to provide a separate gas introduction system or exhaust system for the inside of the concave portion 36, thereby avoiding complicating the apparatus.

Figure 8:
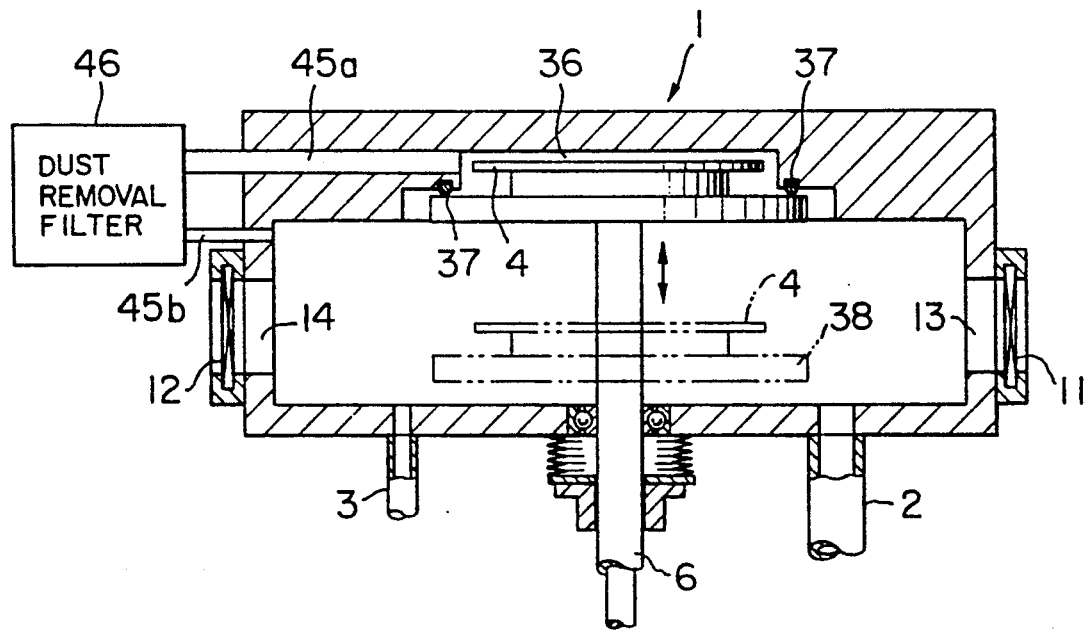
FIG. 8 is a longitudinal sectional view of an example where the small chamber and the inside of the pre-vacuum chamber are connected by a dust removal filter.

Moreover, in the embodiment described above, the description was given for an embodiment where the dust removal filters 40 were housed inside the load-lock chamber 1 but as shown in FIG. 8, a dust removal filter 46 can be provided to the outside of the load-lock chamber 1 in a configuration where the inside of the concave portion 36 and the load-lock chamber 1 communicate via the dust removal filters 46 and the gas flow passages 45a, 45b.

Figure 9:
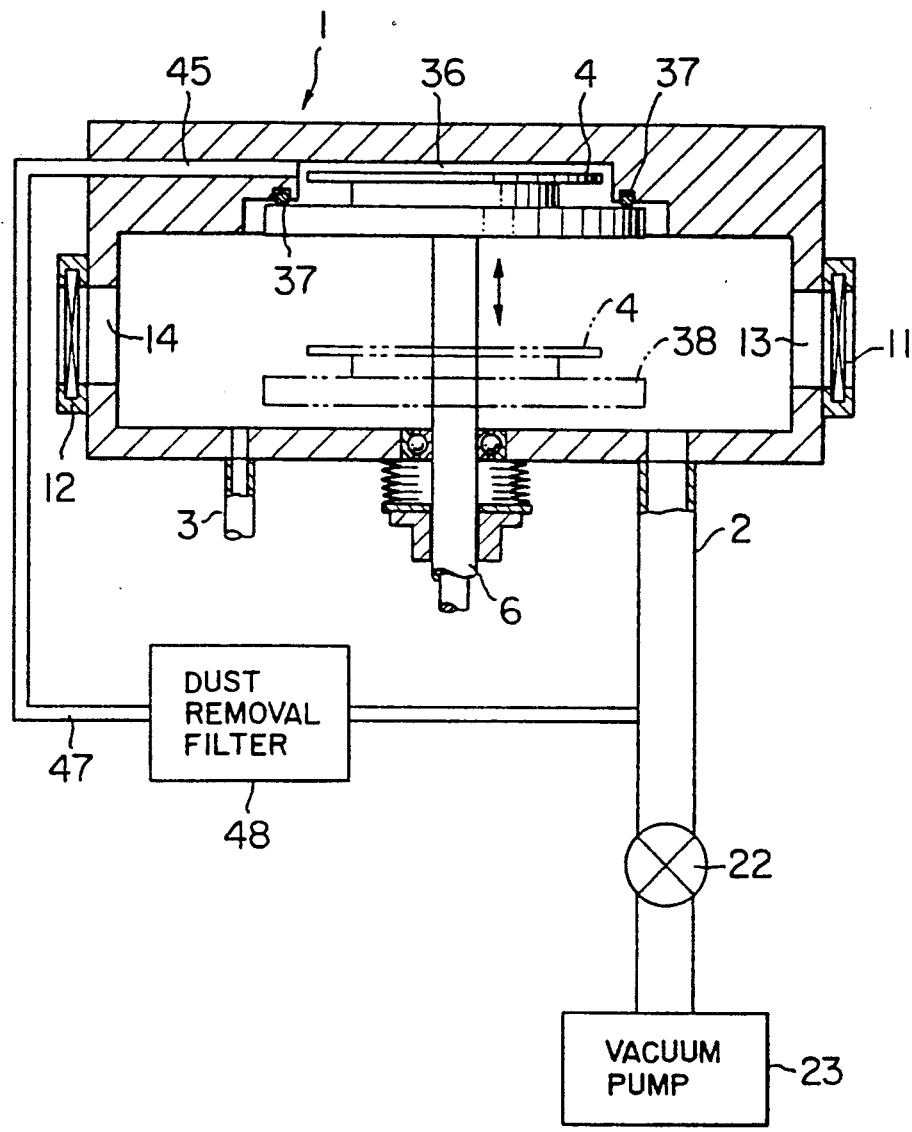
FIG. 9 is a longitudinal sectional view where the small chamber and the pre-vacuum chamber exhaust pipe are connected by a dust removal filter.

Also, as shown in FIG. 9, the pipe 47 connected to the concave portion 36 can be led out and a dust removal filter 48 is inserted into this pipe and the pipe then connected to the exhaust pipe 2 connected to the vacuum pump 23. Moreover, in FIG. 9, the numeral 22 indicates a partition valve inserted into the exhaust pipe 2. If there is this partition valve 22, then it is possible for the dust removal filter 40 to be arranged at a required place, and for filter exchange and maintenance work to be facilitated.

What is claimed is:

1. A vacuum processing apparatus provided with a vacuum processing chamber which implements a required processing to an object of processing, and a pre-vacuum chamber configured so that it can be internally vacuum exhausted, with an object of processing being carried-in and -out of the vacuum processing chamber via the pre-vacuum chamber,
said vacuum processing apparatus comprising a small space which can be airtightly sealed is provided inside said pre-vacuum chamber, so that the object of processing can be temporarily housed into said small space when there is vacuum exhaust from said pre-vacuum chamber and when there is the introduction of air to said pre-vacuum chamber.

2. The vacuum processing apparatus of claim 1, wherein said small space is provided to an upper portion of said pre-vacuum chamber.

3. The vacuum processing apparatus of claim 1, wherein an exhaust pipe and a gas introduction pipe are connected to said small space.

4. The vacuum processing apparatus of claim 1, wherein a carrying-in and a carrying-out opening of said vacuum processing chamber are respectively provided with said pre-vacuum chambers.

5. The vacuum processing apparatus of claim 1, wherein a gas flow passage connects said small space and said pre-vacuum chamber, and said gas flow passage having a dust removal filter inserted into it.

6. The vacuum processing apparatus of claim 1, wherein said small space is connected to a gas flow passage and is connected to an exhaust pipe of said pre-vacuum chamber via an externally provided dust removal filter.

7. The vacuum processing apparatus of claim 1, wherein said object of processing is a semiconductor wafer or a glass substrate for a liquid crystal display (LCD).

* * * * *